(12) United States Patent
Lee et al.

(10) Patent No.: US 6,623,799 B1
(45) Date of Patent: Sep. 23, 2003

(54) CHEMICAL VAPOR DEPOSITION METHOD USING A CATALYST ON A SUBSTRATE SURFACE

(75) Inventors: Ji-Hwa Lee, Seoul (KR); Eui-Seong Hwang, Kyonggi-do (KR)

(73) Assignee: Genitech Co., Ltd. (KR)

( * ) Notice: Subject to any disclaimer, the term of this patent is extended or adjusted under 35 U.S.C. 154(b) by 0 days.

(21) Appl. No.: 09/554,444

(22) PCT Filed: Sep. 11, 1999

(86) PCT No.: PCT/KR99/00539

§ 371 (c)(1),
(2), (4) Date: Jul. 13, 2000

(87) PCT Pub. No.: WO00/15866

PCT Pub. Date: Mar. 23, 2000

(30) Foreign Application Priority Data

Dec. 8, 1998 (KR) ........................ 1998-053575
Sep. 11, 1998 (KR) ........................ 1998-037521

(51) Int. Cl.$^7$ ........................ C23C 16/18; C23C 16/52
(52) U.S. Cl. ............ 427/250; 427/255.23; 427/255.28; 427/255.39; 427/305; 438/681; 438/687

(58) Field of Search ............... 427/248.1, 250, 427/255.23, 255.28, 255.39, 299, 301, 304, 305, 255.26, 255.4; 556/110; 438/680, 681, 687

(56) References Cited

U.S. PATENT DOCUMENTS

| | | | | |
|---|---|---|---|---|
| RE35,614 E | * | 9/1997 | Norman et al. | 427/250 |
| 5,939,150 A | * | 8/1999 | Stelzle et al. | 427/558 |
| 6,156,394 A | * | 12/2000 | Schultz Yamasaki et al. | 427/162 |
| 6,165,555 A | * | 12/2000 | Jun et al. | 427/252 |

* cited by examiner

Primary Examiner—Shrive P. Beck
Assistant Examiner—Wesley Markham
(74) Attorney, Agent, or Firm—Marger Johnson & McCollom, PC

(57) ABSTRACT

A method of chemically depositing a copper film in which a bromine or iodine-containing catalyst component is employed to enhance the deposition rate. The present invention is characterized in that the catalyst component floats on the film surface during the film formation. Accordingly, a film deposition having superior step coverage and high deposition rate is obtained.

4 Claims, 7 Drawing Sheets

(1) = EX. EMBOD. 2
(2) = EX. EMBOD. 1
(3) = COMP. EX. 1

(1) = 50°C
(2) = 100°C
(3) = 150°C
(4) = 200°C (1) = 50°C
(2) = 100°C
(3) = 150°C
(4) = 200°C

RMS Roughness = 106 Å

RMS Roughness = 51.5 Å

RMS Roughness = 252 Å

(1) = EX. EMBOD. 2
(2) = EX. EMBOD. 1
(3) = COMP. EX. 1

CHEMICAL VAPOR DEPOSITION METHOD USING A CATALYST ON A SUBSTRATE SURFACE

TECHNICAL FIELD

The present invention relates to a chemical deposition method, and more particularly, to a method of chemically depositing a film in which a catalyst component is employed to enhance the deposition rate.

BACKGROUND ART

As the overall dimensions of semiconductor devices continue to shrink, the demand is ever increasing to form a film of a uniform thickness despite the unevenness of substrate surface. For example, it should be accomplished in the manufacture of semiconductor devices to fill a contact hole with a diameter of about 100 nm and an aspect ratio of 10. Chemical deposition method has an advantage of forming a film of a relatively uniform thickness on an uneven substrate surface. However, this can be achieved only when the film formation is controlled by surface reactions. If the formation of a film is controlled by vapor phase reaction or mass transport rate at which the deposition sources travel to the substrate surface, although chemical deposition is utilized, it is difficult to obtain a film of uniform thickness. One solution to the above-mentioned problem is lowering the substrate temperature. Slow surface reaction, not the mass transport, controls the deposition rate and vapor phase reactions are suppressed at a lower temperature. However, the lowered surface reaction rate could increase the process time for forming a film of desired thickness.

In recent years, techniques of forming interconnects of semiconductor devices using copper have been brought to people's attention. That is, copper would be a good substitute for a commonly-used aluminum because of increasing demands for high-speed semiconductor devices. The presence of copper will retard electromigration and improve the overall reliability of the interconnect structure. However, copper has disadvantages of difficult processing and low resistance to oxidation, compared with aluminum. For example, the etching process of a copper film requires much time because of the difficult processing. Consequently, damascene structures have been developed to simplify the process steps required to form electrical interconnect structures. Electroplating has been typically used to form a copper film, but chemical deposition or sputtering could preferably be used therefor considering the incorporation into other semiconductor processing.

The method of forming a copper film by chemical deposition is disclosed by Norman et al. in U.S. Pat. No. 5,085,731, U.S. Pat. No. 5,094,701, and U.S. Pat. No. 5,098,516. In the above patented techniques, a copper film was chemically deposited by using a volatile $Cu^{+1}$-hexafluoroacetylacetonate-L complex as a deposition source, where L represents a neutral Lewis base. By using such a $Cu^{+1}$ compound as a deposition source, a highly pure copper film could be obtained even at a substrate temperature of less than 200° C. However, other articles report that the copper film deposited by such a method has a low deposition rate of 500 Å/min and rough surface.

DISCLOSURE OF INVENTION

Accordingly, it is an object of the present invention to provide a method of chemically depositing a film at a higher deposition rate by providing high surface reaction rate without adversely affecting the step coverage.

In order to accomplish the aforementioned object, the present invention provides an improved method of chemically depositing a film by supplying gas phase sources on a substrate. The method comprises the step of introducing a catalyst component onto the substrate for facilitating the surface deposition reaction of the gas phase sources. The improvement is that the catalyst component is not buried under the film to be deposited but moved onto the surface of the film during the deposition. In the embodiments, the catalyst component can be introduced onto the substrate during or prior to the chemical deposition. Preferably, the film is a copper film and the catalyst component includes a halogen atom. More Preferably, the halogen atom is iodine or bromine.

In the case of using iodine catalyst component, the iodine is introduced by using a source selected from a group of consisting of iodine molecules, an alkane containing not more than 8 carbon atoms with iodine atoms substituted for hydrogen atoms up to four, a silicon-substituted alkane containing not more than 8 carbon atoms with iodine atoms substituted for hydrogen atoms up to four, the iodine-substituted alkane groups with fluorine or chlorine atoms substituted for at least one of remaining hydrogen atoms, and a molecule containing an iodine atom represented by the following formula (1).

$$R_1 I \qquad (1)$$

wherein $R_1$ represents hydrogen, alkylcarbonyl, carboxy, ether, or a substituted alkyl group with fluorines or chlorines substituted for hydrogens.

More particularly, the source for introducing the iodine can be selected from the group consisting of iodoethane, iodomethane, trifluoroiodomethane, diiodomethane, 2-iodopropane, and 2-methyl-2-iodopropane.

In the case of using bromine catalyst component, the bromine is introduced by using a source selected from a group of consisting of bromine molecules, an alkane group containing not more than 8 carbon atoms with bromine atoms substituted for hydrogen atoms up to four, a silicon-substituted alkane group containing not more than 8 carbon atoms with bromine atoms substituted for hydrogen atoms up to four, the bromine-substituted alkane groups with fluorine or chlorine atoms substituted for at least one of remaining hydrogen atoms, and a molecule containing a bromine atom represented by the following formula (2).

$$R_2 Br \qquad (2)$$

wherein $R_2$ represents hydrogen, alkylcarbonyl, carboxy, ether, or a substituted alkyl group with fluorines or chlorines substituted for hydrogens.

More particularly, the source for introducing the bromine can be selected from the group consisting of bromotrimethylsilane, bromoethane, 2-bromopropane, and 2-methyl-2-bromopropane.

If a catalyst component such as iodine or bromine is introduced onto the substrate according to the above methods, a higher deposition rate can be achieved compared to the case of using the same deposition sources at a same temperature without the catalyst component.

The behavior of iodoethane on a copper single crystal is described by Lin et al. in Journal of Physical Chemistry, Vol. 96, p8529, 1992. In the article, the iodoethane is decomposed into iodine and an ethyl group on the (111) surface of copper single crystal at a relatively low temperature of less than 120 K. The decomposed ethyl group is desorbed as an ethene, leaving beta-hydrogen adsorbed on the copper surface at 274 K. The adsorbed hydrogen is desorbed as an ethane after being combined with an other ethyl group at 274 K, or desorbed as a hydrogen molecule at 320 K. As a result, iodine remains on the copper surface up to 950 K.

The foregoing and other objects, features, and advantages of the invention will be apparent from the following more particular description of a preferred embodiment of the invention, as illustrated in the accompanying drawings.

BEST MODES FOR CARRYING OUT THE INVENTION

Comparative Example 1

A reference copper film was formed by the following chemical deposition in order to give a comparison with copper films according to the embodiments of the present invention. A titanium nitride (TiN) film was first formed onto a silicon single crystal by magnetron sputtering in a nitrogen atmosphere, and then the single crystal was cut to a 1 cm×1 cm size to use as a substrate. The reactor containing the substrate was evacuated by a rotary pump up to several mTorr, and then residue gases were removed therefrom by injecting argon gas into the reactor at a flow rate of 20 sccm. The bubbler containing a copper source operated while immersed in a bath maintained at a constant temperature of 30° C., and the connection line between the bubbler and reactor was also maintained at 30° C. The substrate was heated with an infrared lamp to a temperature in the range of 30–300° C. The copper source was supplied into the reactor by bubbling argon gas through $Cu^{+1}$-hexafluoroacetylacetonate-trimethylvinylsilane at a flow rate of 20 sccm, forming a copper film on the substrate. In order to monitor the generation and growth of copper grains as well as the surface roughness of a copper film, the copper film was irradiated with He—Ne laser beams during the copper deposition to measure the intensity variations in reflected beams. Copper films were chemically deposited only by introducing the above copper source at various substrate temperatures. The deposition rate of copper film versus substrate temperature is shown by a solid line (3) in FIG. 1.

Exemplary Embodiment 1

The copper film was formed in the same manner as described in the comparative example 1, except that the supply of copper source was stopped during the deposition of copper film while iodoethane was introduced into the reactor. The residual iodoethane in the reactor was removed by injecting argon gas therein at a flow rate of 20 sccm. Thereafter, only copper source was continuously supplied into the reactor by an argon carrier gas, forming a copper film up to 1 µm thick.

Figure 1:
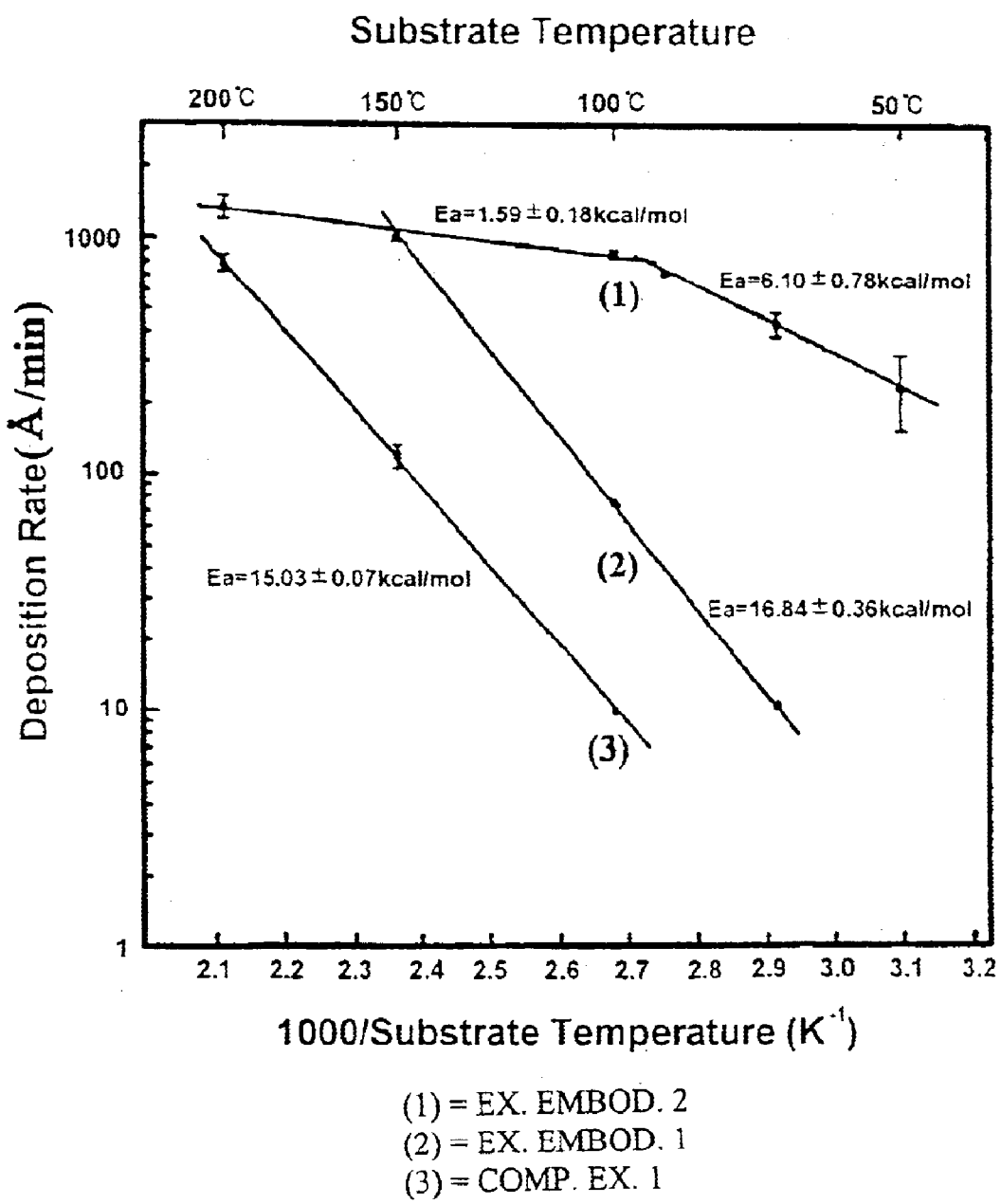
FIG. 1 is a graphical depiction of copper film deposition rate versus substrate temperature in accordance with or without introducing an iodine compound.

The deposition rate of copper film at each substrate temperature is shown by a solid line (2) in FIG. 1. Referring to FIG. 1, it will be understood that the deposition rate of exemplary embodiment 1 is 7–10 times higher than that of comparative example 1 under a same temperature condition.

The observed increase in deposition rate can be interpreted to be caused by the contribution of a catalyst component to the decomposition of copper source, the catalyst component being generated from the decomposition of iodoethane onto the substrate. Additionally, 7–10 times higher deposition rate is maintained up to the formation of a 1 µm thickness copper film. It is inferred from the observation that the catalyst component is not buried under a copper film to be deposited but remains thereon nor desorbed into the vapor phase.

Exemplary Embodiment 2

The copper film was formed in the same manner as described in the comparative example 1 except that the copper source was supplied at a 60 mTorr iodoethane partial pressure. The deposition rate of copper film at each substrate temperature is shown by a solid line (1) in FIG. 1. It is found that the deposition rate of exemplary embodiment 2 is about 100 times higher than that of comparative example 1 at a substrate temperature of 100° C. In the case of supplying only copper source no copper film was formed at a relatively low temperature of 50° C., but in the exemplary embodiment 2 a deposition rate of 250 Å/min was achieved even at such a low temperature.

In the exemplary embodiments 1 and 2, the resistivity of a copper film formed at a temperature in the range of 50 to 200° C. was 2.01±0.13 µΩ·cm, which is comparable to the resistivity 1.7 µΩ·cm of pure copper. Moreover, the copper thin film chemically deposited at a substrate temperature of 50° C. while supplying the copper source together with iodoethane also had a high electrical conductivity. On the contrary, the copper film deposited at a substrate temperature of less than 130° C. by using only a copper source had a low electrical conductivity, which is construed to be caused by electron scattering at grain boundaries.

The copper films deposited by the exemplary embodiments 1 and 2 were analyzed by Auger electron spectroscopy. Only copper was detected by the spectroscopy.

Figure 2A:
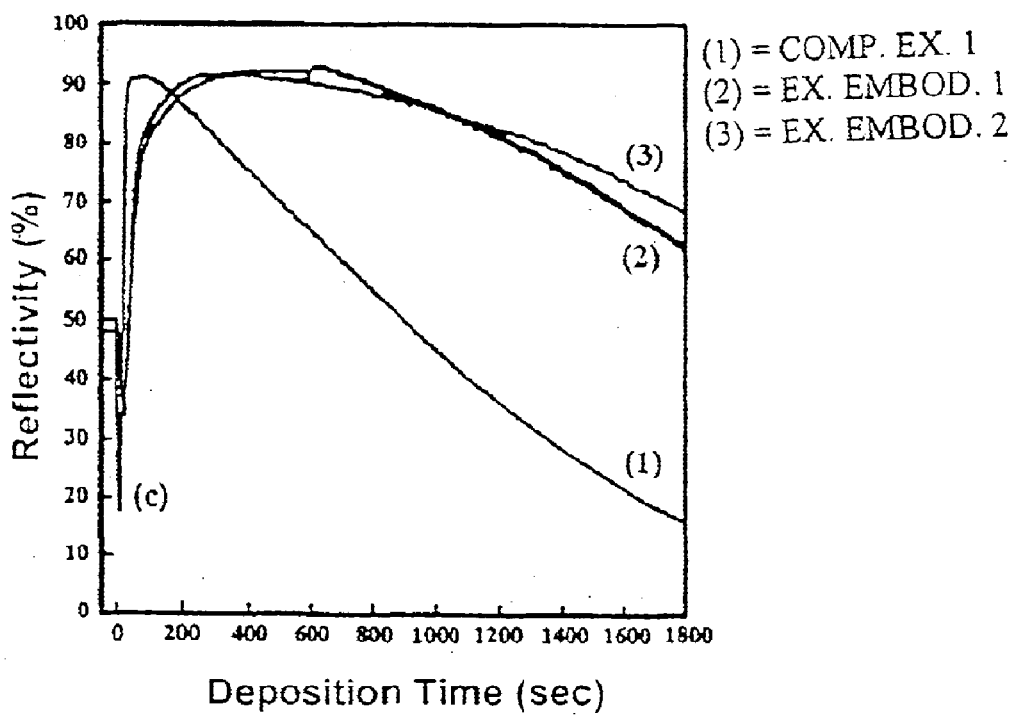
FIGS. 2A to 2B are graphical depictions of deposited film reflectivity versus deposition time and film thickness.
Figure 2B:
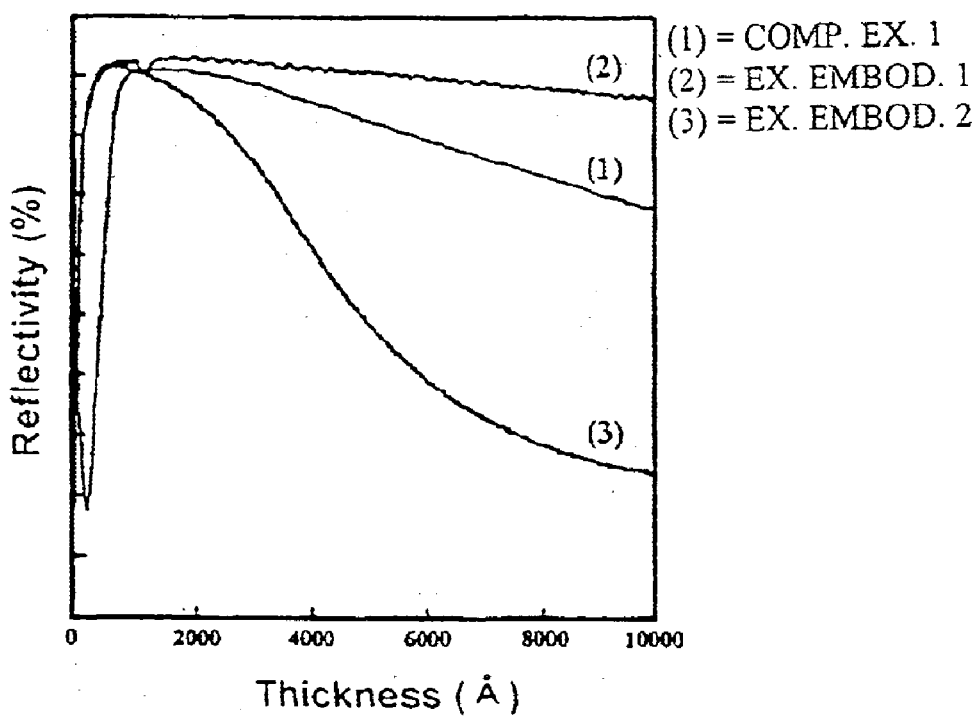

The variations in the surface reflectivity of copper films were measured by irradiation with He—Ne laser beams (wavelength: 632.8 nm) during the respective deposition steps of the comparative example 1 and the exemplary embodiments 1 and 2, and were shown in FIGS. 2A and 2B. Here, the curve (1) represents the result of the comparative example 1, the curve (2) represents the result of the exemplary embodiment 1, and the curve (3) represents the result of the exemplary embodiment 2. FIG. 2A shows reflectivity variation versus deposition time, and is redrawn in FIG. 2B according to the film thickness with the assumption of constant deposition rate. As shown in FIG. 2A, the copper film formed while supplying the copper source together with iodoethane has a higher reflectivity compared with the copper film formed by supplying only copper source. In general, a film having rough surface morphology has a low reflectivity due to irregular reflection when irradiated with laser beams. It is understood from the above results that the film surface is more planar in the order of comparative example 1, exemplary embodiment 2, and exemplary embodiment 1.

Figure 3A:
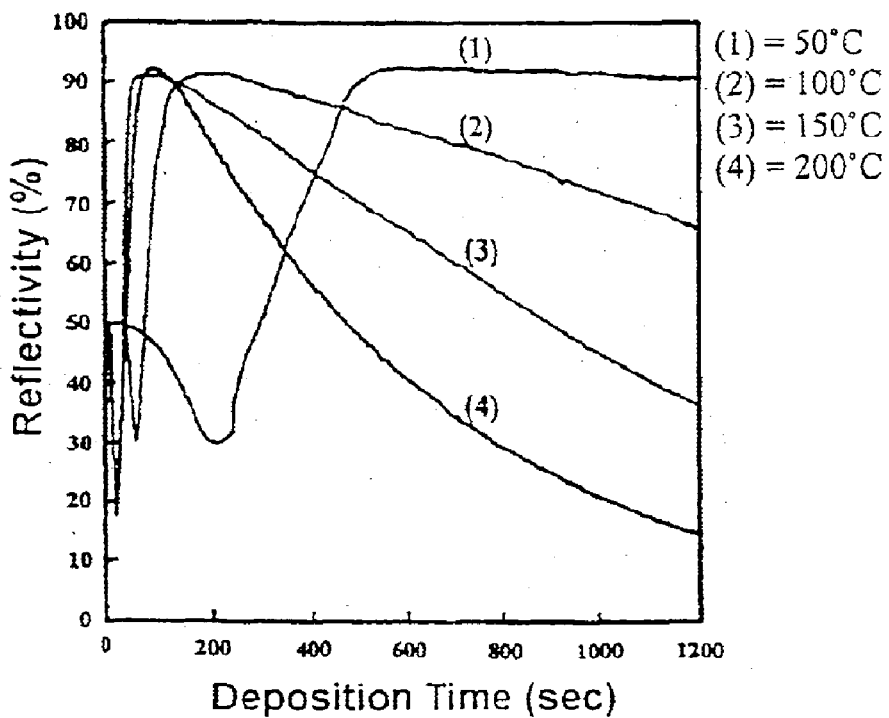
FIGS. 3A to 3B are graphical depictions of deposited copper film reflectivity versus depostion time and film thickness, when the copper films are deposited introducing an iodine compound onto a substrate at various substrate temperatures.
Figure 3B:
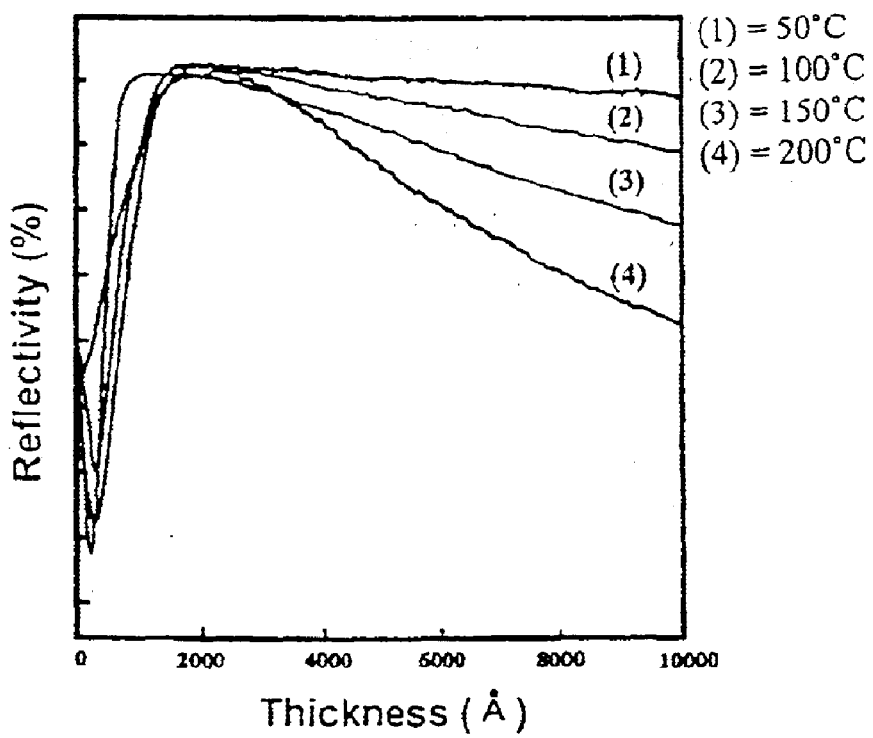

The surface reflectivity of copper films deposited in the exemplary embodiment 2, while supplying the copper source together with iodoethane, at temperatures of (1) 50° C., (2) 100° C., (3) 150° C., and (4) 200° C. was shown in FIGS. 3A and 3B, respectively. FIG. 3A shows reflectivity variations versus deposition time, and FIG. 3B shows reflectivity variations versus film thickness. Referring to FIGS. 3A and 3B, it is understood that the film surface becomes more planar with the decrease of deposition temperature. This may result from small grain size of copper film deposited at low temperature.

Figure 4A:
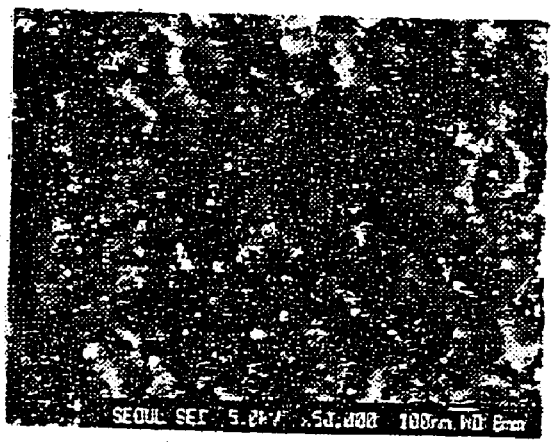
FIGS. 4A to 4C are SEM (Scanning Electron Microscope) photographs of deposited copper film surfaces.
Figure 4B:
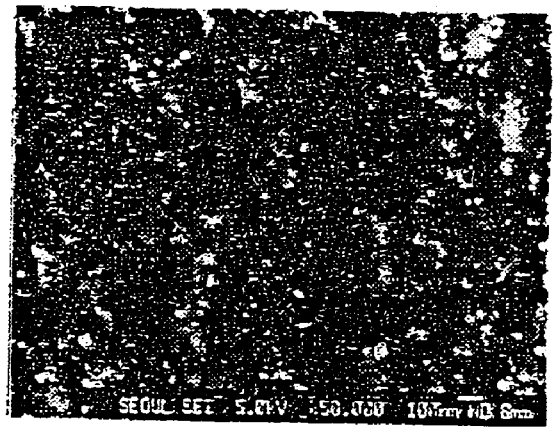
Figure 4C:
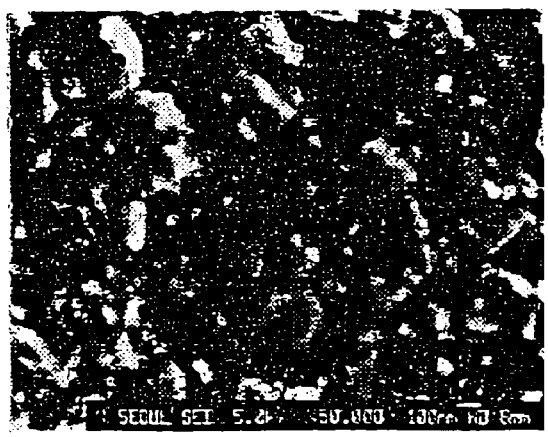
Figure 5A:
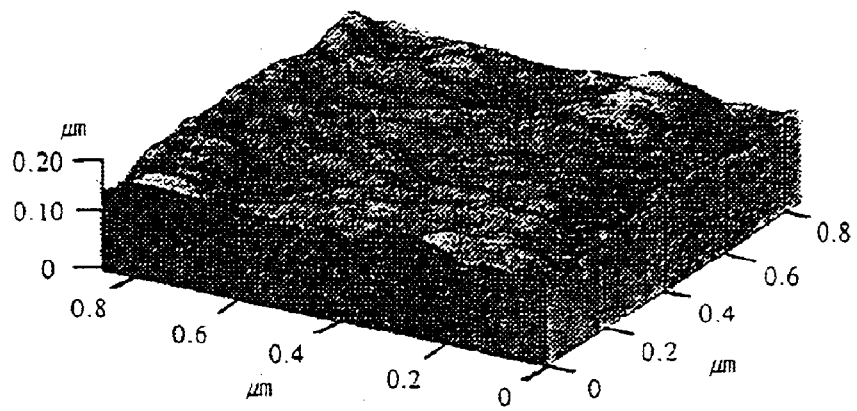
FIGS. 5A to 5C are surface roughness data of deposited copper films obtained by AFM (Atomic Force Microscopy) analysis.
Figure 5B:
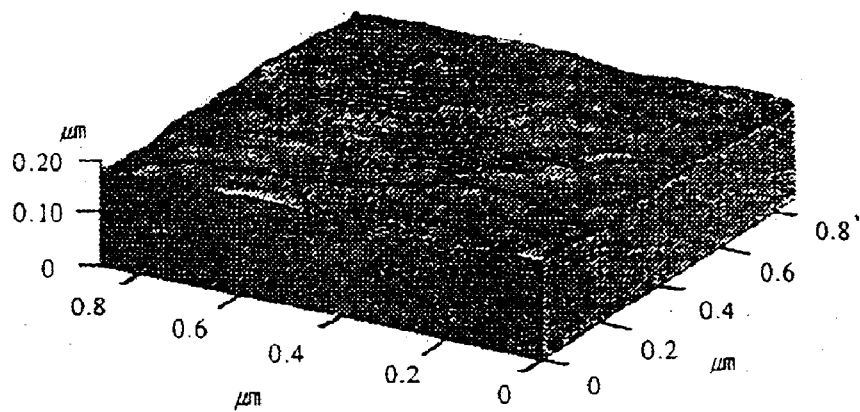
Figure 5C:
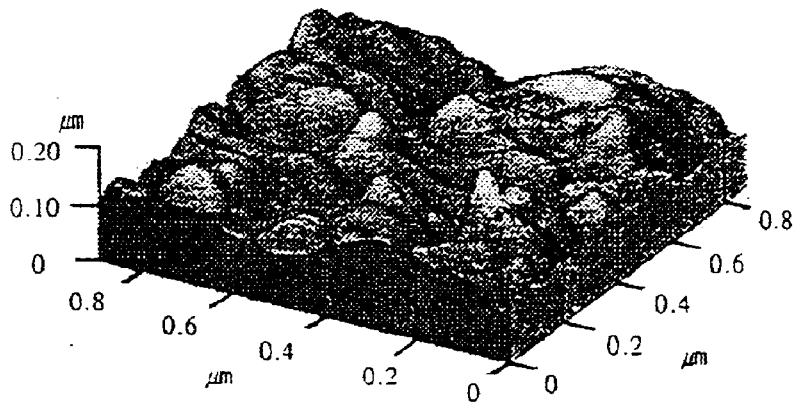

The microscopic surface morphology of copper films formed at a substrate temperature of 150° C. under the conditions of comparative example 1, exemplary embodiment 2, and exemplary embodiment 1 was observed by a SEM, and the results were shown in FIG. 4C, FIG. 4A and FIG. 4B, respectively. The surface roughness of the respective films was analyzed by an AFM, obtaining 3-dimension images and root mean square roughness thereof. The results were shown in FIG. 5C, FIG. 5A and FIG. 5B, respectively. Referring to FIG. 4A to FIG. 5C, the copper film formed while supplying the copper source together with iodoethane has more planar surface compared with the copper film formed by supplying only copper source.

Figure 6:
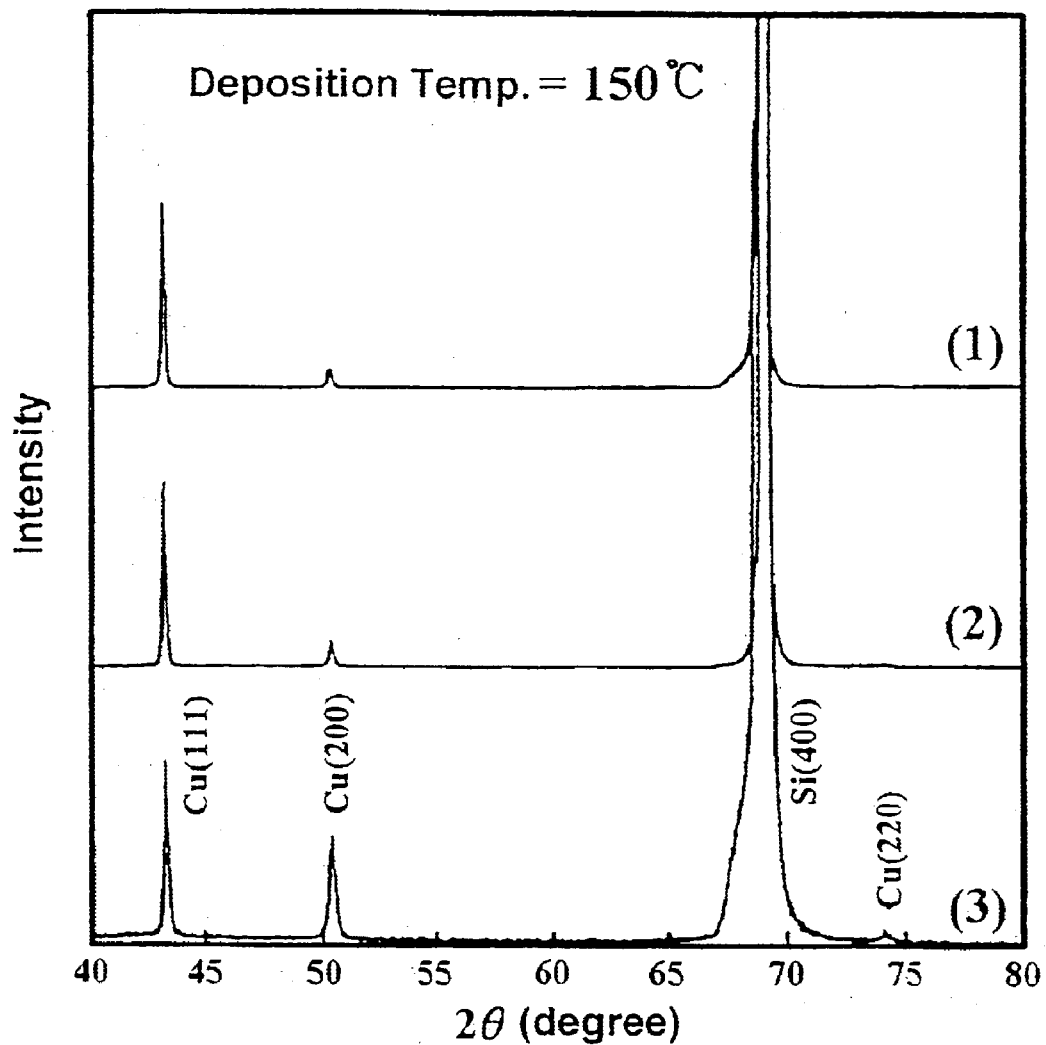
FIG. 6 is an XRD (X-ray diffraction) graph characterizing the crystal structure of deposited copper films.

X-ray diffraction patterns of copper films formed by comparative example 1, exemplary embodiment 2, and exemplary embodiment 1 were shown in (3), (1) and (2) of FIG. 6, respectively. In the case of exemplary embodiment 2, the intensity of copper (111) diffraction peaks is greatly increased, which indicates many copper grains were aligned in the (111) direction. This enhanced surface planarization is attributed to the fact that many grains are grown aligned in a same direction.

Exemplary Embodiment 3

Figure 7:
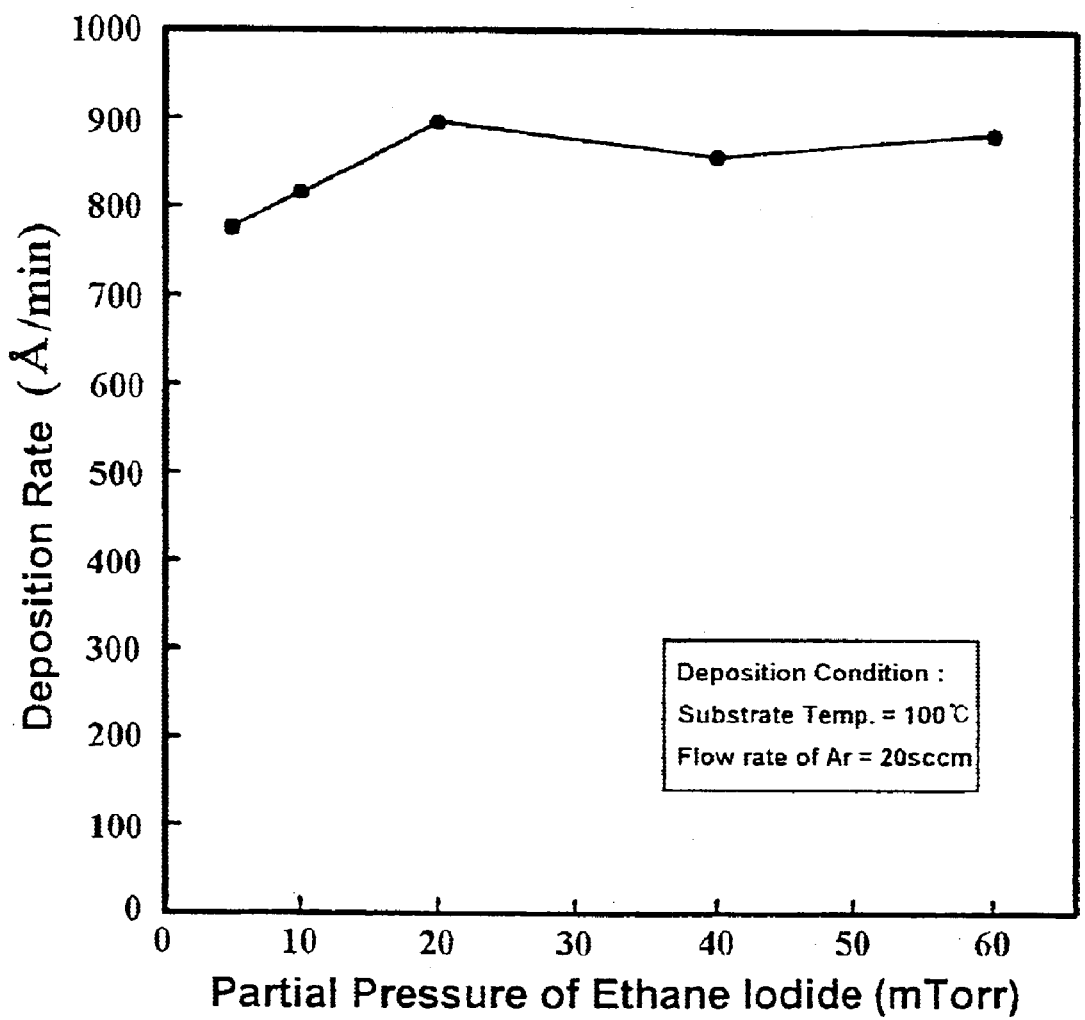
FIG. 7 is a graphical depiction of copper film deposition rate versus partial pressure of iodoethane used for introducing the catalyst component.

The process conditions were the same as the exemplary embodiment 2, except that the film was deposited at various iodoethane partial pressures and at a temperature of 100° C. FIG. 7 is a graphical depiction of copper film deposition rate versus partial pressure of iodoethane. Referring to FIG. 7, it is found that the partial pressure of iodoethane has little effect on the deposition rate at a partial pressure in the range of 5 to 60 mTorr.

Exemplary Embodiment 4

The process conditions were the same as the exemplary embodiment 2, except that the film was deposited at a 60 mTorr iodomethane partial pressure instead of iodoethane. The deposition rate was nearly the same as that of the exemplary embodiment 2. The resistivity of the copper film formed at a temperature in the range of 70 to 200° C. was 2.03±0.23 $\mu\Omega\cdot$cm, which is comparable to that of the exemplary embodiment 2.

Exemplary Embodiment 5

The process conditions were the same as the exemplary embodiment 2, except that, the film was deposited on a substrate heated to 150° C. for 10 minutes while supplying copper sources together with trifluoroiodomethane onto the substrate. The resistivity of deposited copper film was 1.78 $\mu\Omega\cdot$cm, and the deposition rate was 1530 Å/min.

Exemplary Embodiment 6

The process conditions were the same as the comparative example 1, except for the following steps. First, during the deposition, the supply of copper source was stopped when the substrate reflectivity reached a maximum as shown in FIG. 2A, and then diiodomethane ($CH_2I_2$) was supplied for 5 minutes. Thereafter, the formation of copper film continued for 10 minutes while supplying only the copper source using an argon carrier gas of a flow rate of 20 sccm. The resistivity of deposited copper film was 1.83 $\mu\Omega\cdot$cm, and the deposition rate was 1580 Å/min.

Exemplary Embodiment 7

The process conditions were the same as the exemplary embodiment 6, except for the following steps. First, the substrate was treated with diiodomethane for 5 minutes. Thereafter, the formation of copper film continued for 10 minutes while supplying only the copper source using an argon carrier gas of a flow rate of 20 sccm. The resistivity of deposited copper film was 1.86 $\mu\Omega\cdot$cm, and the deposition rate was 1860 Å/min.

From the result of the exemplary embodiment 7, it is understood that the enhancement of deposition rate can be achieved even when the film to be deposited is not formed prior to the introduction of catalyst component. Iodomethane treatments directly on the TiN substrate do not exhibit the enhancement of deposition rate. This may be ascribed to the presence of $TiO_2$ layer which prevents the adsorption on the TiN substrate surface. The $TiO_2$ layer is unavoidably grown on the TiN substrate when it is exposed to the air.

This was demonstrated by following experiment. First, the $TiO_2$ layer grown on the TiN substrate was removed by wet etching, and then the surface of TiN substrate was treated with iodomethane for 5 minutes. Thereafter, a copper film was formed while supplying only copper source. The copper film formed by the above method has a deposition rate 2–3 times higher compared with a copper film formed without iodomethane treatment. Unlike the iodomethane, diiodomethane seems to have catalytic effect even with the presence of $TiO_2$ layer on a TiN substrate.

Exemplary Embodiment 8

The process conditions were the same as the comparative example 1, except for the following steps. First, during the deposition at a substrate temperature of 150° C., the supply of copper source was stopped when the substrate reflectivity reached a maximum as shown in FIG. 2A, and then bromotrimethylsilane [$(CH_3)_3SiBr$] of 50 mTorr partial pressure was supplied for 5 minutes. Thereafter, the formation of copper film continued for 20 minutes while supplying only the copper source using an argon carrier gas of a flow rate of 20 sccm. The resistivity of deposited copper film was 1.99 $\mu\Omega\cdot$cm, and the deposition rate was 1500 Å/min.

Thus, the invention provides a method for the satisfactory formation of a copper film having superior step coverage and high deposition rate. Moreover, high quality film can be formed by supplying a chemical deposition source together with a catalyst component, even at such a low temperature as no film is formed only by supplying of a chemical deposition source. With the use of Cu(1) organometallic compound source together with iodine or bromine, a highly planar copper film can be formed.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

What is claimed is:

1. A method for chemically depositing a copper film on a substrate, comprising: introducing a catalyst component onto said substrate, said catalyst component selected from the group consisting of iodoethane, iodomethane, trifluoroiodomethane, diiodomethane, 2-iodopropane, and 2-methyl-2-iodopropane; and then supplying an organometallic copper(I) gas phase film formation source.

2. A method for chemically depositing a copper film on a substrate, comprising: introducing a catalyst component onto said substrate, said catalyst component selected from the group consisting of bromotrimethylsilane, bromoethane, 2-bromopropane, and 2-methyl-2-bromopropane; and then supplying an organometallic copper(I) gas phase film formation source.

3. A method for chemically depositing a copper film on a substrate, comprising: supplying gas phase organometallic copper(I) film formation sources substantially contemporaneously with supplying catalyst components onto said substrate for facilitating said film deposition, wherein said catalyst component is selected from the group consisting of iodoethane, iodomethane, trifluoroiodomethane, diiodomethane, 2-iodopropane, and 2-methyl-2-iodopropane.

4. A method for chemically depositing a copper film on a substrate, comprising: supplying gas phase organometallic copper(I) film formation sources substantially contemporaneously with supplying catalyst components onto said substrate for facilitating said film deposition, wherein said catalyst component is selected from the group consisting of bromotrimethylsilane, bromoethane, 2-bromopropane, and 2-methyl-2-bromopropane.

* * * * *